US012599004B2

(12) United States Patent
Vincent et al.

(10) Patent No.: US 12,599,004 B2
(45) Date of Patent: Apr. 7, 2026

(54) SEMICONDUCTOR DEVICE WITH ACTIVE MOLD PACKAGE AND METHOD THEREFOR

(71) Applicant: NXP USA, INC., Austin, TX (US)

(72) Inventors: Michael B. Vincent, Chandler, AZ (US); Scott M. Hayes, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 647 days.

(21) Appl. No.: 17/936,132

(22) Filed: Sep. 28, 2022

(65) Prior Publication Data

US 2024/0105660 A1    Mar. 28, 2024

(51) Int. Cl.
| | |
|---|---|
| *H01L 23/00* | (2006.01) |
| *H10W 70/05* | (2026.01) |
| *H10W 70/09* | (2026.01) |
| *H10W 70/60* | (2026.01) |
| *H10W 70/65* | (2026.01) |
| *H10W 70/685* | (2026.01) |
| *H10W 74/01* | (2026.01) |
| *H10W 74/10* | (2026.01) |
| *H10W 70/652* | (2026.01) |

(52) U.S. Cl.
CPC ........... *H10W 70/09* (2026.01); *H10W 70/05* (2026.01); *H10W 70/093* (2026.01); *H10W 70/611* (2026.01); *H10W 70/614* (2026.01); *H10W 70/65* (2026.01); *H10W 70/685* (2026.01); *H10W 74/016* (2026.01); *H10W 74/117* (2026.01); *H10W 70/6528* (2026.01)

(58) Field of Classification Search
CPC ..... H01L 24/19; H01L 24/20; H01L 21/4853; H01L 21/4857; H01L 21/565; H01L 23/3128; H01L 23/5383; H01L 23/5386; H01L 23/5389; H01L 2224/214; H01L 2924/351
See application file for complete search history.

(56) References Cited

U.S. PATENT DOCUMENTS

| | | | |
|---|---|---|---|
| 9,018,749 | B2 | 4/2015 | Tam et al. |
| 9,777,380 | B2 | 10/2017 | MacDonald et al. |
| 10,163,658 | B2 | 12/2018 | Sirinorakul et al. |

(Continued)

OTHER PUBLICATIONS

LPKF Laser & Electronics, "The Power of Laser Technology", Company Presentation, Nov. 17, 2017.

(Continued)

*Primary Examiner* — Marlon T Fletcher
*Assistant Examiner* — Christina A Sylvia

(57) ABSTRACT

A method of forming a semiconductor device is provided. The method includes forming a conductive die connector having a first end connected to a die pad of a semiconductor die. A first encapsulant formulated for selective activation by way of a laser encapsulates at least a portion of the semiconductor die. A first conductive trace of a redistribution layer is formed by plating a conductive material on a first laser activated path on a first major surface of the first encapsulant. The first conductive trace is directly connected to a second end of the die connector. A second encapsulant formulated for selective activation by way of a laser encapsulates at least the first conductive trace and exposed portions of the first major surface of the first encapsulant.

16 Claims, 17 Drawing Sheets

1600

(56) References Cited

U.S. PATENT DOCUMENTS

| | | | |
|---|---|---|---|
| 2010/0001396 A1 | | 1/2010 | Meyer et al. |
| 2014/0296411 A1* | | 10/2014 | Cheng ...................... C08K 3/22 |
| | | | 524/451 |
| 2018/0130749 A1* | | 5/2018 | Tsai .................... H01L 21/4857 |
| 2018/0233467 A1 | | 8/2018 | Lin |
| 2019/0259629 A1 | | 8/2019 | Ziglioli |
| 2020/0006225 A1* | | 1/2020 | Tsou ...................... H10W 20/42 |
| 2020/0137892 A1* | | 4/2020 | Ling .................... H05K 3/4038 |
| 2020/0312774 A1* | | 10/2020 | Yu ............................ H10P 72/74 |
| 2021/0090908 A1 | | 3/2021 | Renjan et al. |
| 2021/0091030 A1* | | 3/2021 | Marin ..................... H01L 25/50 |
| 2022/0199564 A1 | | 6/2022 | Derai et al. |
| 2024/0186303 A1 | | 6/2024 | Gong et al. |

OTHER PUBLICATIONS

LPKF Laser & Electronics, "LPKF LDS: Laser Direct Structuring for 3D Molded Interconnect Devices", Brochure, no date available.
U.S. Appl. No. 17/930,515, filed Sep. 8, 2022, entitled "Semiconductor Device With Through Package via and Method Therefor".

* cited by examiner

SEMICONDUCTOR DEVICE WITH ACTIVE MOLD PACKAGE AND METHOD THEREFOR

BACKGROUND

Field

This disclosure relates generally to semiconductor device packaging, and more specifically, to semiconductor devices with active mold packaging and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device with active mold packaging. The active mold packaging includes encapsulants formulated for selective activation by way of a laser in a laser direct structuring process. The semiconductor device includes a core encapsulant at least partially encapsulating a semiconductor die and a package substrate formed on a major surface of the core encapsulated semiconductor die. The package substrate is formed as a build-up package substrate and includes plated conductive traces separated by one or more encapsulant layers. The core encapsulant and each of the one or more encapsulant layers of the package substrate are epoxy molding compounds which include a chemical additive that forms metal particles when activated by way of a laser. First conductive traces of the package substrate are formed by way of a plating process utilizing activated patterned paths on the major surface. The first conductive traces are interconnected to die pads of the semiconductor die. A subsequent encapsulant layer of the package substrate is formed over the first conductive traces and exposed portions of the major surface. Openings through the subsequent encapsulant and patterned paths are formed using laser ablation thus activating the first encapsulant at the sidewalls of the openings and along the patterned paths. Second conductive traces of the package substrate are formed by way of a plating process utilizing activated openings sidewalls and patterned paths of the subsequent encapsulant. The second conductive traces are interconnected to first conductive traces by way of a via portion of the second conductive traces. The via portion may be configured as an under-bump metallization for subsequent attachment of solder balls. By forming the semiconductor device with the core encapsulant and each of the one or more encapsulant layers of the package substrate in this manner, mismatch of mechanical properties such coefficient of thermal expansion is virtually eliminated, thus improving overall semiconductor device reliability.

Figure 1:
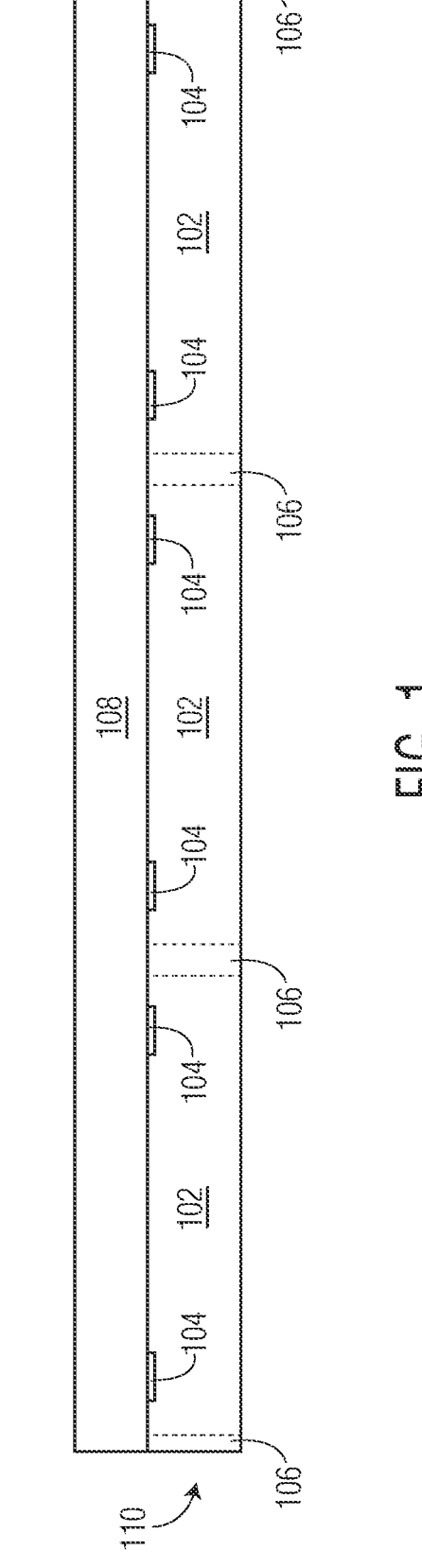
FIG. 1 through FIG. 12 illustrate, in simplified cross-sectional views, an example semiconductor device having active mold packaging at stages of manufacture in accordance with an embodiment.

FIG. 1 illustrates, in a simplified cross-sectional view, an example semiconductor device 100 having active mold packaging at a stage of manufacture in accordance with an embodiment. At this stage of manufacture, the semiconductor device 100 includes a semiconductor wafer 110 having an active side encapsulated with an encapsulant 108. The semiconductor wafer 110 includes a plurality of semiconductor die 102 (sites) separated from one another by singulation lanes 106 illustrated by dashed lines. In this embodiment, the encapsulant 108 is formulated for selective activation by way of a laser. The encapsulant 108 (e.g., epoxy molding compound) includes a chemical additive (e.g., copper chromate) capable of being activated by way of a laser in a laser direct structuring process. For example, when activated, a chemical reaction is initiated causing the activated portion of the encapsulant to form metal particles sufficient to serve as a seed layer for electroless plating (e.g., copper).

Each of the semiconductor die 102 has an active side (e.g., major side having circuitry) and a backside (e.g., major side opposite of the active side). The semiconductor die 102 includes die pads 104 formed at the active side. Die pads 104 may be configured for connection to a package substrate by way of conductive die connectors formed at a subsequent stage, for example. The term "conductive," as used herein, generally refers to electrical conductivity unless otherwise specified. As depicted in FIG. 1, the plurality of semiconductor die 102 is configured in an active-side-up orientation with the encapsulant 108 formed over the active side of the wafer 110. The semiconductor wafer 110 may be formed from any suitable semiconductor material, such as silicon, germanium, gallium arsenide, gallium nitride, and the like. Each of the semiconductor die 102 may further include digital circuits, analog circuits, RF circuits, power circuits, memories, processors, the like, and combinations thereof at the active side.

Figure 2:
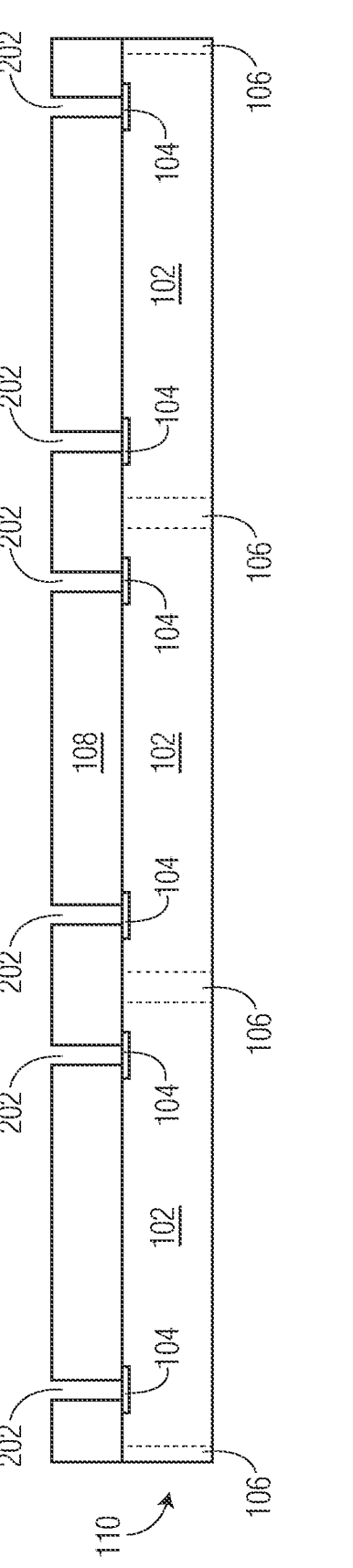

FIG. 2 illustrates, in a simplified cross-sectional view, the example semiconductor device 100 at a subsequent stage of manufacture in accordance with an embodiment. At this stage, the semiconductor device 100 includes openings 202 formed through the encapsulant 108 by way of a laser. In this embodiment, the through encapsulant openings 202 expose predetermined portions of the die pads 104 of the plurality of semiconductor die 102. By forming the openings 202 by way of laser ablation, the additive of the encapsulant 108 is activated at the sidewalls causing a thin conductive lining (not shown) to be formed in the openings. The thin conductive linings formed in the openings 202 of the encapsulant 108 serve as a catalyst (e.g., seed layer) for electroless plating at a subsequent stage of manufacture.

Figure 3:
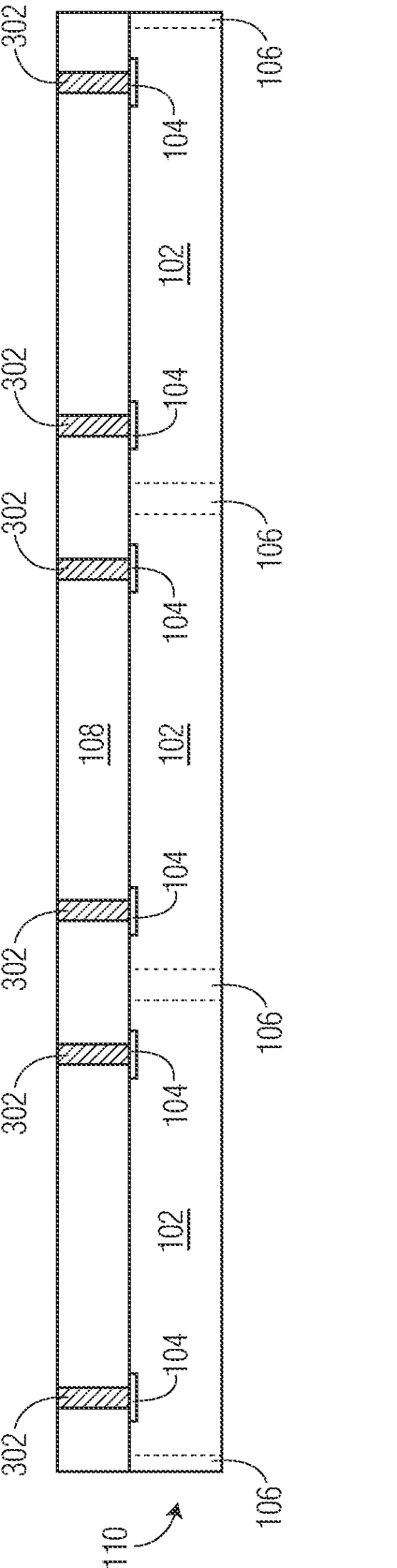

FIG. 3 illustrates, in a simplified cross-sectional view, the example semiconductor device 100 at a subsequent stage of manufacture in accordance with an embodiment. At this stage, the semiconductor device 100 includes a plurality of conductive die connectors 302 formed in the respective openings 202 of FIG. 2. In this embodiment, the conductive die connectors 302 are formed by substantially filling the through encapsulant openings 202 with a plated conductive material (e.g., copper). In this embodiment, the encapsulated wafer 110 is subjected to an electroless plating operation by utilizing the thin conductive linings formed on the activated sidewalls as seed layers. A first end of the conductive die connectors 302 are conductively connected to the exposed die pads 104 of the plurality of semiconductor die 102 by way of the plating operation.

Figure 4:
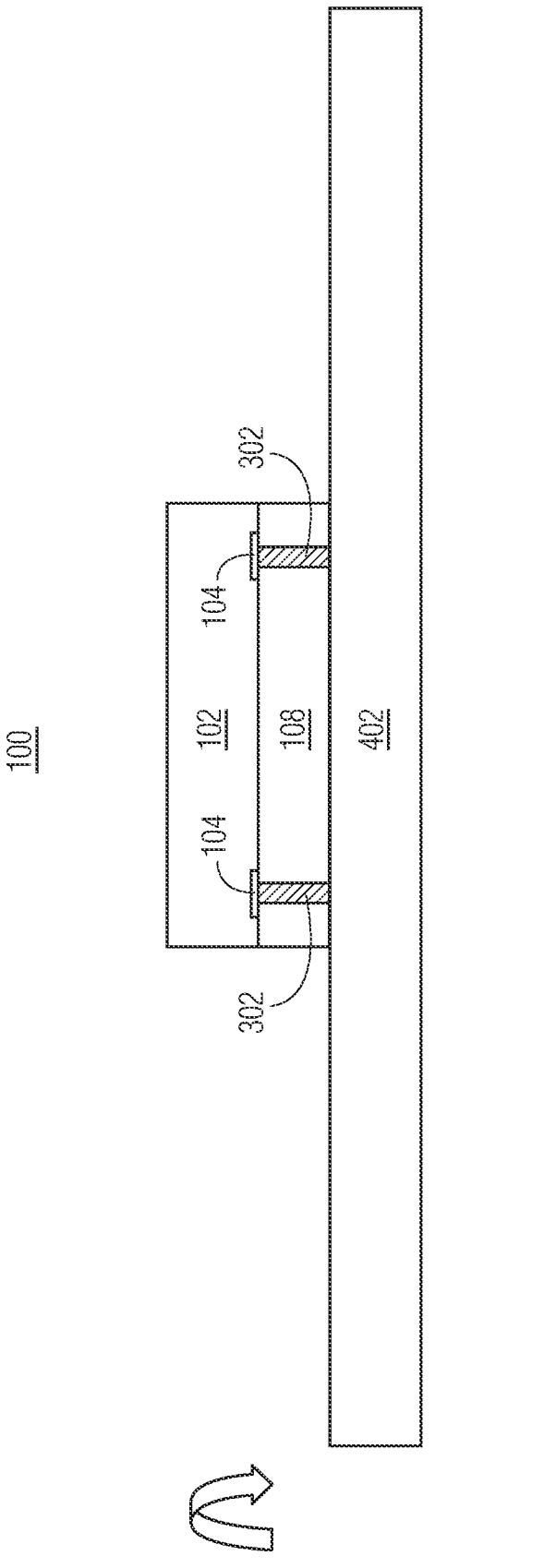

FIG. 4 illustrates, in a simplified cross-sectional view, the example semiconductor device 100 at a subsequent stage of manufacture in accordance with an embodiment. At this stage, the semiconductor device 100 includes a singulated semiconductor die 102 and corresponding portion of the encapsulant 108 formed on the active side. In this embodiment, the encapsulated semiconductor die 102 is reconfigured in an active-side-down orientation and placed on a carrier substrate 402. In this configuration, a major surface of the encapsulant 108 and exposed second ends of the conductive die connectors 302 are temporarily affixed to the carrier substrate 402.

Figure 5:
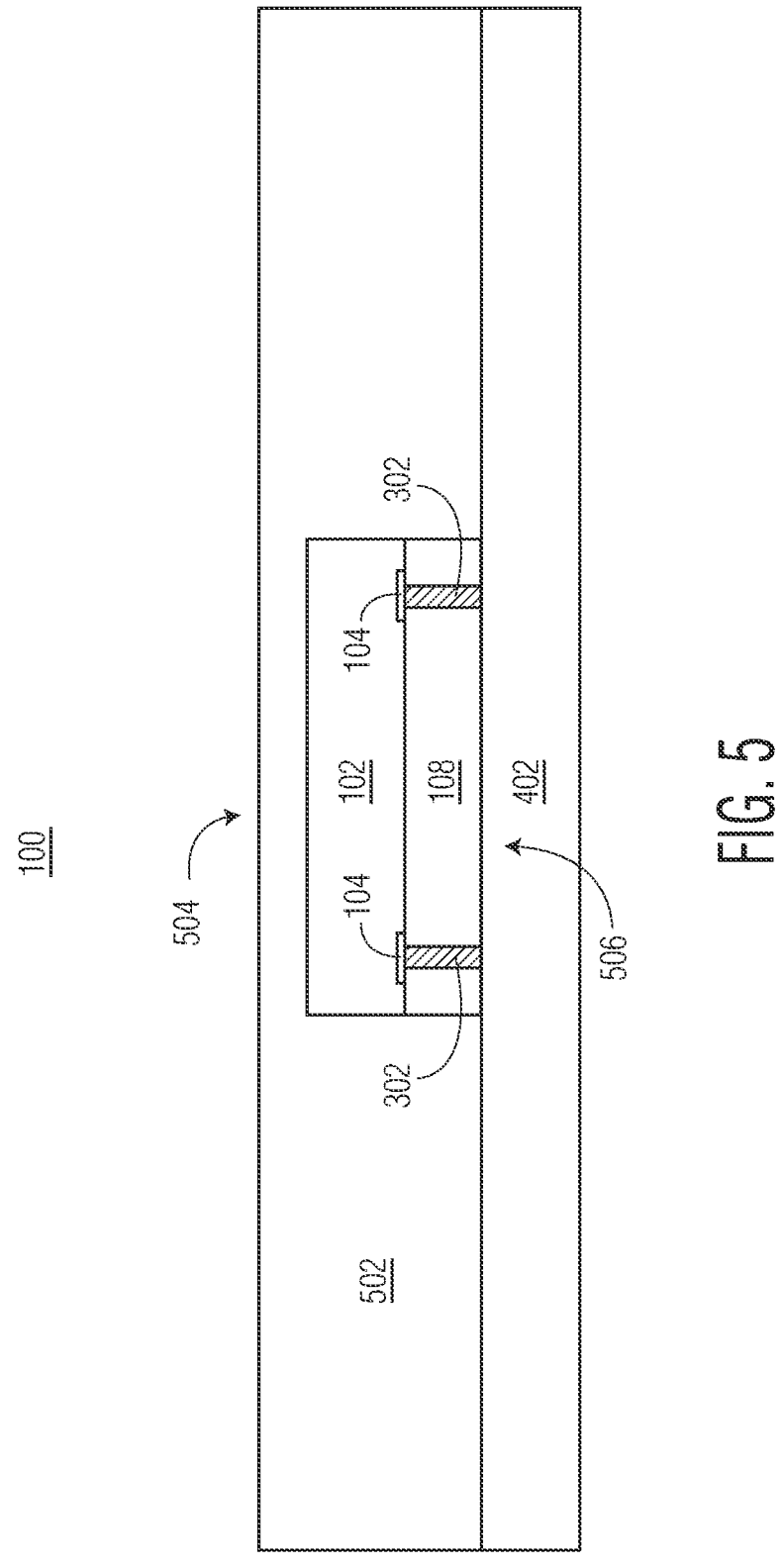

FIG. 5 illustrates, in a simplified cross-sectional view, the example semiconductor device 100 at a subsequent stage of manufacture in accordance with an embodiment. At this stage, the semiconductor device 100 includes the singulated semiconductor die 102 and portion of the encapsulant 108 encapsulated with a second encapsulant 502. In this embodiment, the encapsulant 502 is an epoxy molding compound formulated for selective activation by way of a laser in a laser direct structuring process. The singulated semiconductor die 102 and portion of the encapsulant 108 are overmolded with the encapsulant 502 by way of a molding process (e.g., injection molding). In this embodiment, the encapsulant 502 encapsulates the backside and sidewalls of the semiconductor die 102 and sidewalls of the encapsulant 108. The encapsulated semiconductor device 100 at this stage includes a first major surface 504 (e.g., top surface) and a second major surface 506 (e.g., opposite major surface) temporarily affixed to the carrier substrate 402.

Figure 6:
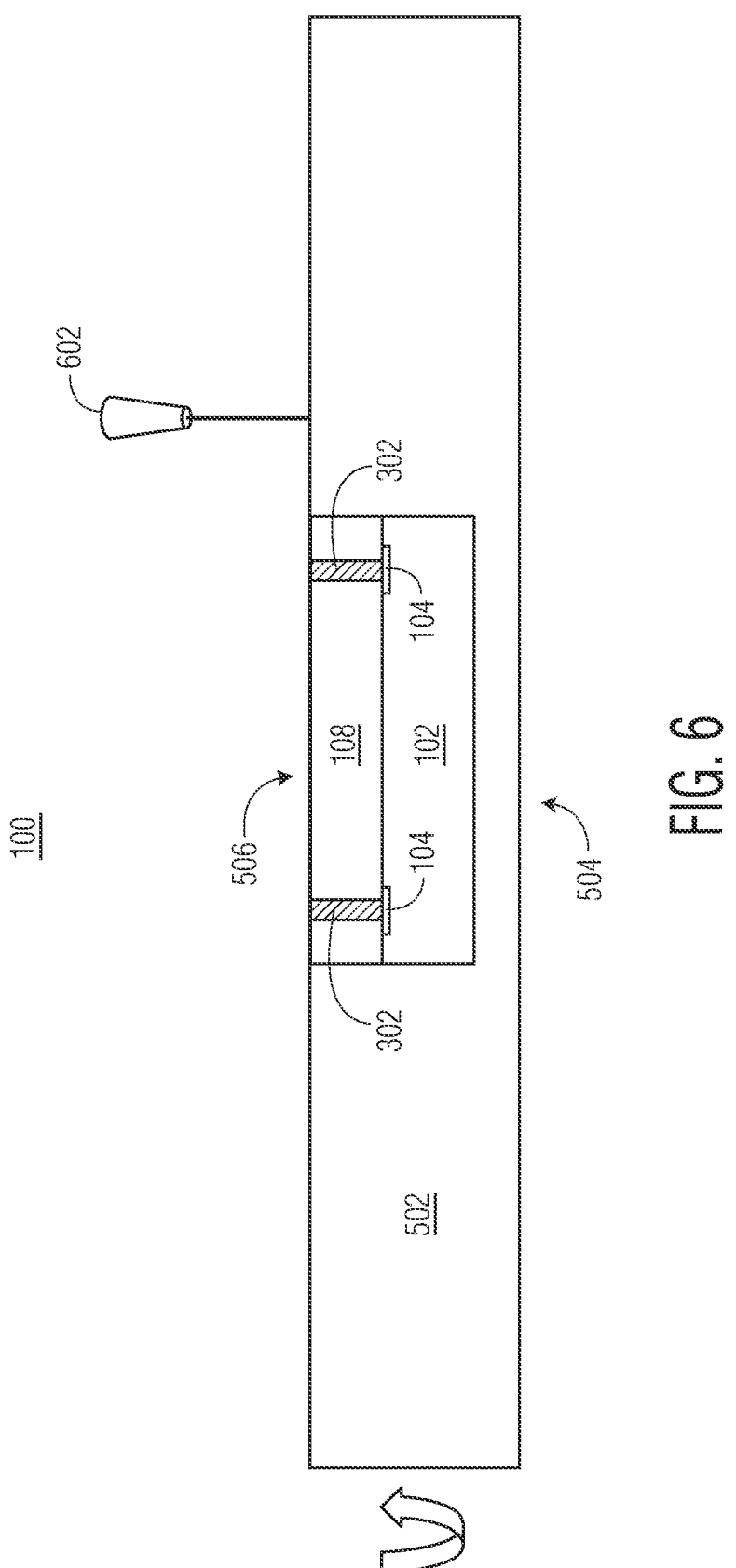

FIG. 6 illustrates, in a simplified cross-sectional view, the example semiconductor device 100 at a subsequent stage of manufacture in accordance with an embodiment. At this stage, the semiconductor device 100 includes patterned paths formed by way of a laser 602 at the major surface 506. The encapsulated semiconductor device 100 is separated from the carrier substrate 402 of FIG. 5 and reconfigured (e.g., flipped) in a bottom-side-up orientation. The second ends of the conductive die connectors 302 are exposed through the encapsulant 108 at the major surface 506. In this embodiment, the patterned paths at the major surface 506 are formed by way of laser ablation causing portions of the encapsulants 108 and 502 to be activated along the paths. The resulting thin conductive patterned paths formed at the major surface 506 serve as a catalyst (e.g., seed layer) for electroless plating at a subsequent stage of manufacture. In the embodiment, the major surface 506 includes surfaces of the encapsulants 108 and 502 and second ends of the conductive die connectors 302 substantially coplanar.

Figure 7:
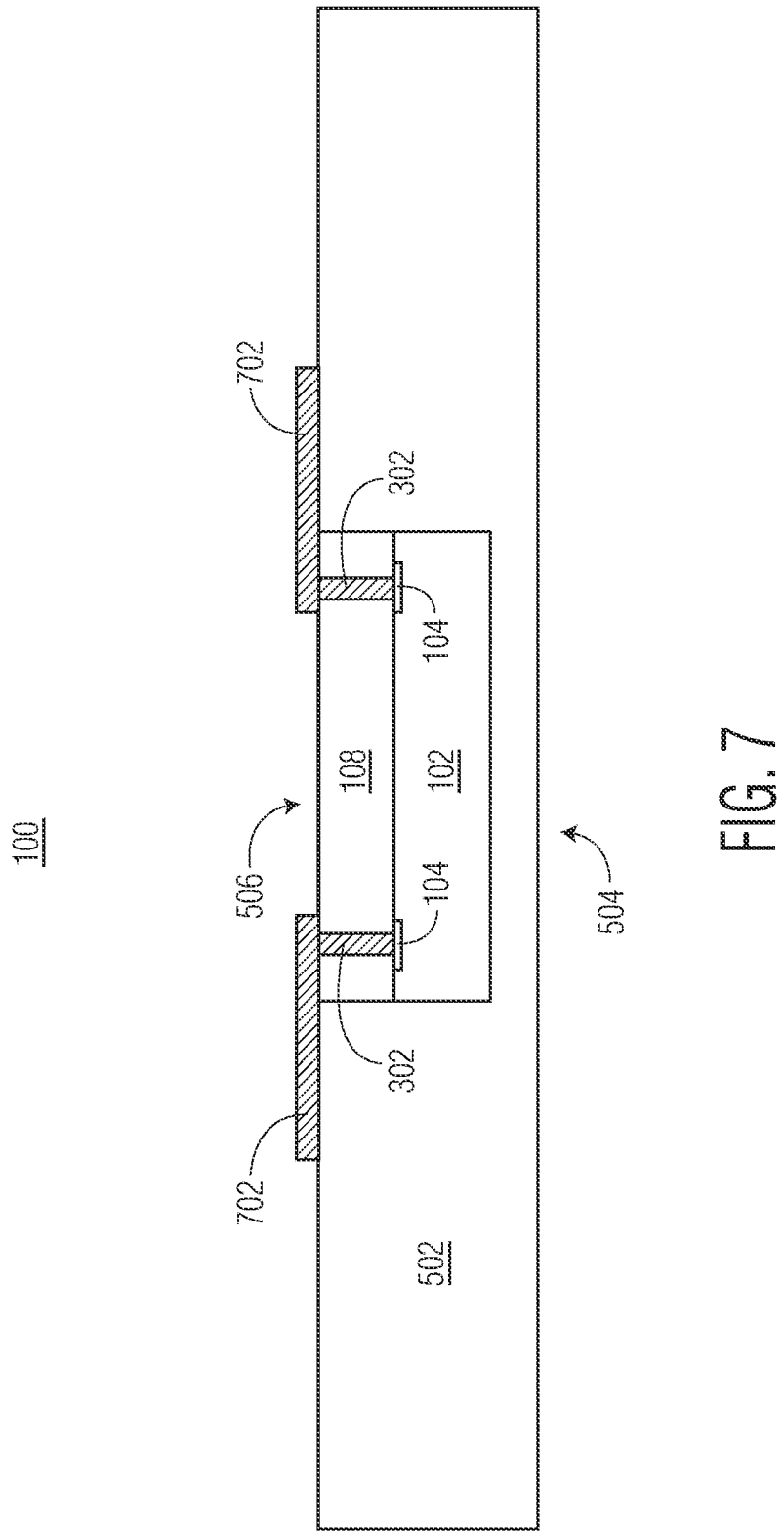

FIG. 7 illustrates, in a simplified cross-sectional view, the example semiconductor device 100 at a subsequent stage of manufacture in accordance with an embodiment. At this stage, the semiconductor device 100 includes conductive traces 702 formed on the activated patterned paths at the major surface 506. In this embodiment, the semiconductor device 100 is subjected to an electroless plating operation to form a plated conductive material layer (e.g., copper) on the activated patterned paths and exposed portions of the conductive die connectors 302. The formed conductive traces 702 are conductively connected to the second ends of the conductive die connectors 302 and provide an interconnection to the die pads 104 of the semiconductor die 102 by way of the conductive die connectors 302. In this embodiment, the formed conductive traces 702 serve as a first interconnect layer of a build-up package substrate characterized as a build-up redistribution layer (RDL) type package substrate.

Figure 8:
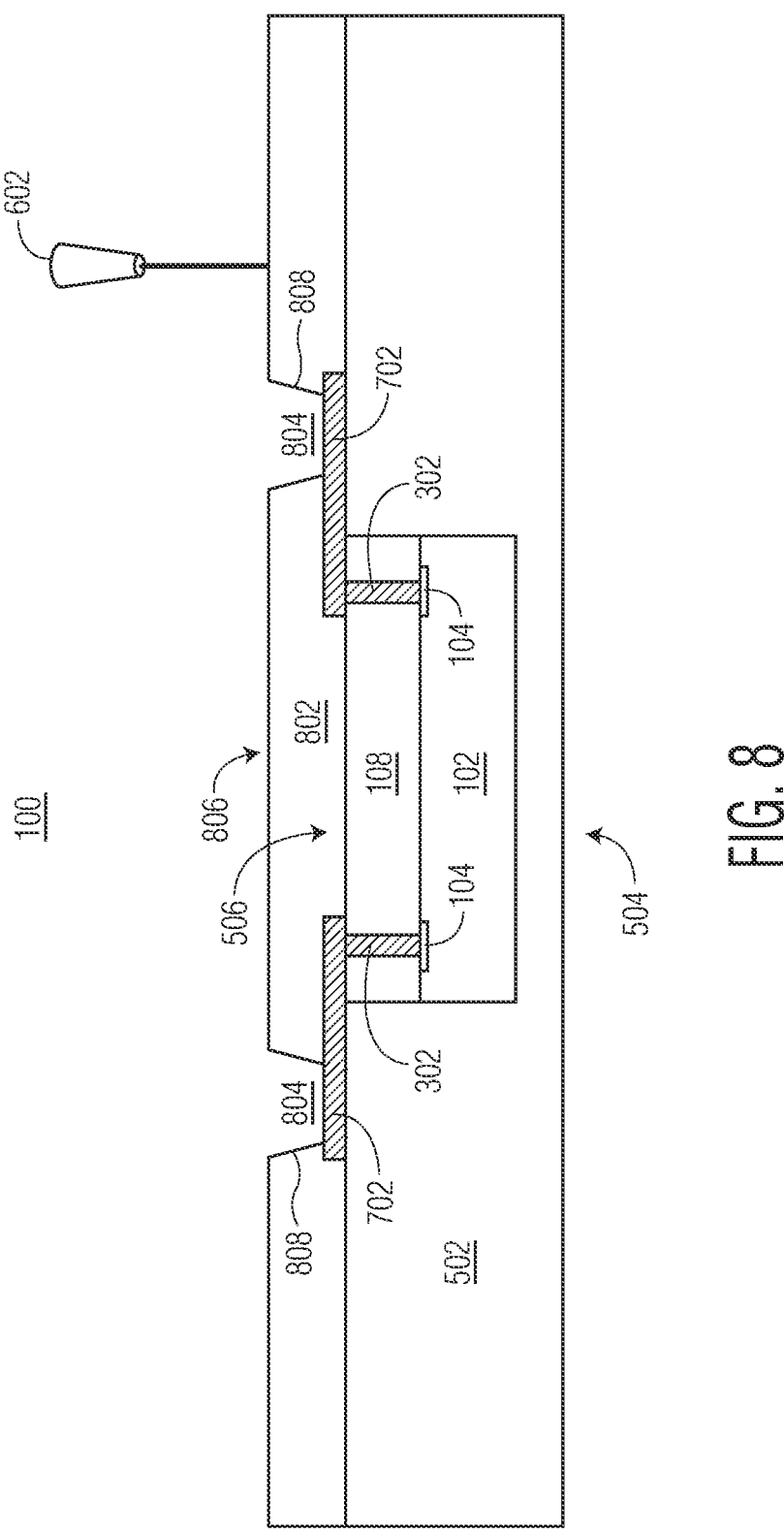

FIG. 8 illustrates, in a simplified cross-sectional view, the example semiconductor device 100 at a subsequent stage of manufacture in accordance with an embodiment. At this stage, the semiconductor device 100 includes the conductive traces 702 and exposed portions of the major surface 506 encapsulated with a third encapsulant 802. In this embodiment, the encapsulant 802 is an epoxy molding compound formulated for selective activation by way of a laser in a laser direct structuring process. The conductive traces 702 and exposed portions of the major surface 506 are overmolded with the encapsulant 802 by way of a molding process. In this embodiment, openings 804 and patterned paths are formed by way of the laser 602 at a major surface 806 of the encapsulant 802. The through encapsulant openings 804 expose predetermined portions of the conductive traces 702. By forming the openings 804 and the patterned paths by way of laser ablation, thin conductive linings are formed at the sidewalls 808 of the openings and along the patterned paths at the major surface 806 of the encapsulant 802. The activated sidewalls 808 and activated patterned paths serve as a seed layer for electroless plating at a subsequent stage of manufacture.

Alternatively, in some embodiments, the encapsulant 502 may be formulated without the aforementioned laser activated chemical additive while maintaining compatible mechanical properties such as coefficient of thermal expansion. Accordingly, the steps depicted in FIG. 6 and FIG. 7 may be omitted such that the encapsulant 802 encapsulates the major surface 506 and the through encapsulant openings 804 are located to expose predetermined portions of the second ends of the conductive die connectors 302. Conductive traces formed at a subsequent stage may be configured with a via (e.g., vertical) portion formed on sidewalls 808 of respective openings 804 to provide a direct connection to the die connectors 302.

Figure 9:
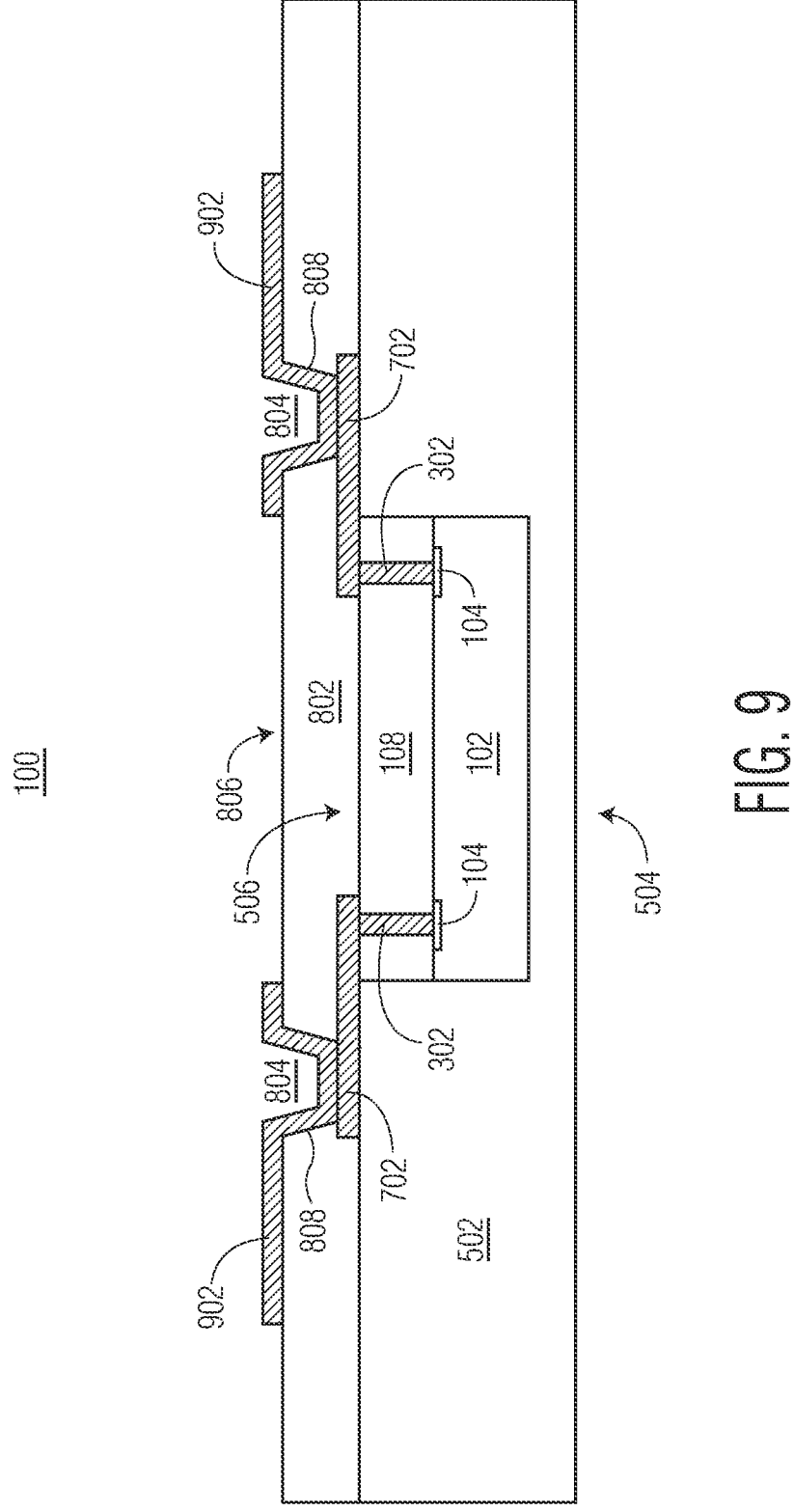

FIG. 9 illustrates, in a simplified cross-sectional view, the example semiconductor device 100 at a subsequent stage of manufacture in accordance with an embodiment. At this stage, the semiconductor device 100 includes conductive traces 902 formed on the activated sidewalls 808 of the openings 804 and activated patterned paths at the major surface 806. In this embodiment, the semiconductor device 100 is subjected to an electroless plating operation to form a plated conductive material layer (e.g., copper) on the activated sidewalls 808, patterned paths, and exposed portions of the conductive traces 702. Each of the conductive traces 902 is configured having a via (e.g., vertical) portion formed on sidewalls 808 of respective openings 804 and a lateral (e.g., horizontal) portion that extends laterally along a portion of the major surface 806 of the encapsulant 802.

The via portion is configured to provide a vertical interconnection between the lateral portion of the conductive traces 902 and respective underlying conductive traces 702. In this embodiment, the formed conductive traces 902 are configured to serve as a second interconnect layer of the build-up package substrate with the encapsulant 802 configured to serve as a dielectric layer of the package substrate.

Figure 10:
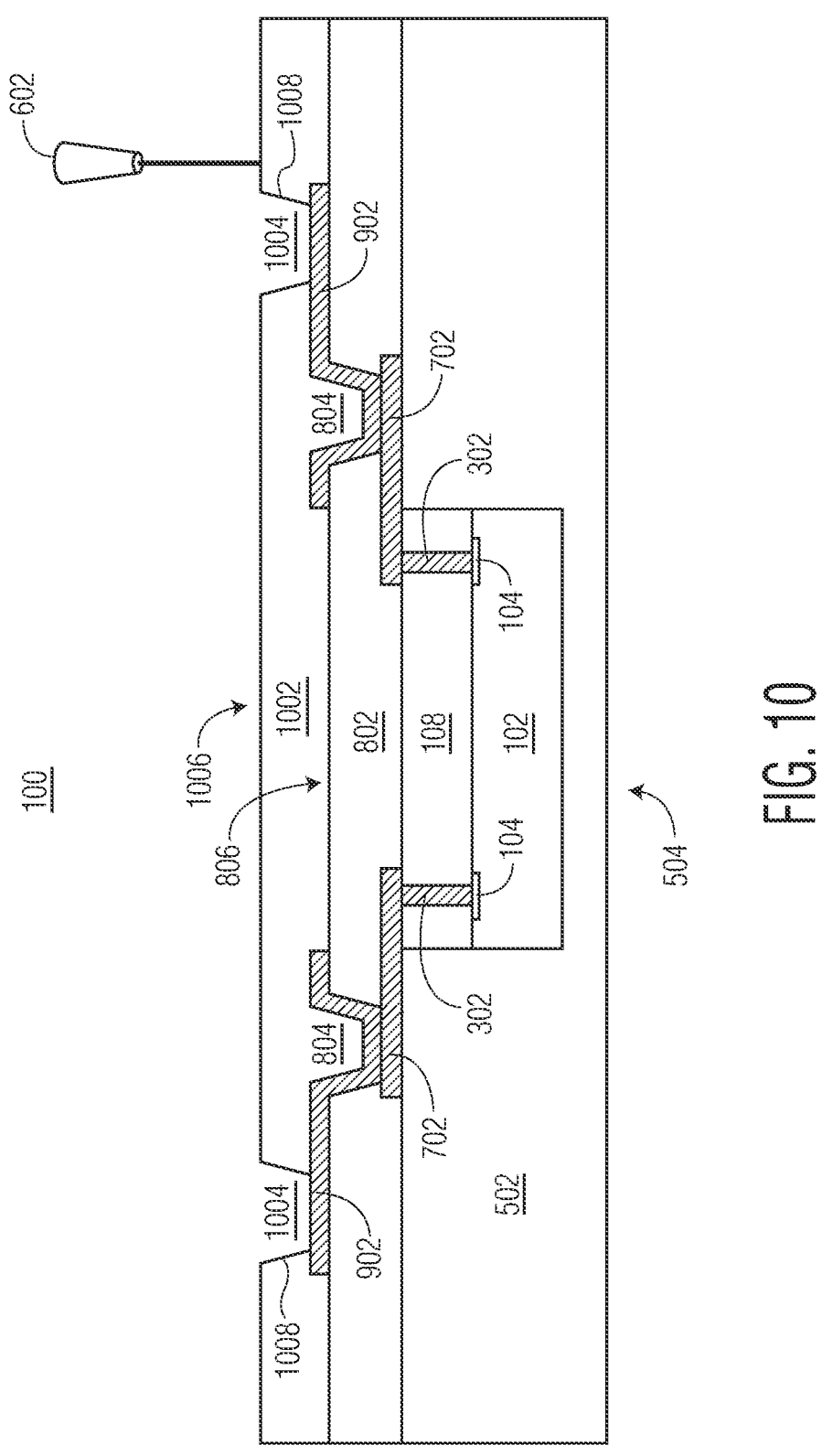

FIG. 10 illustrates, in a simplified cross-sectional view, the example semiconductor device 100 at a subsequent stage of manufacture in accordance with an embodiment. At this stage, the semiconductor device 100 includes the conductive traces 902, openings 804, and exposed portions of the major surface 806 encapsulated with a fourth encapsulant 1002. In this embodiment, the encapsulant 1002 is an epoxy molding compound formulated for selective activation by way of a laser in a laser direct structuring process. The conductive traces 902 and exposed portions of the major surface 806 are over-molded with the encapsulant 1002 by way of a molding process. In this embodiment, openings 1004 are formed by way of the laser 602 at a major surface 1006 of the encapsulant 1002. The through encapsulant openings 1004 expose predetermined portions of the conductive traces 902. By forming the openings 1004 by way of laser ablation, thin conductive linings are formed at the sidewalls 1008 of the openings 1004. The activated sidewalls 1008 and activated patterned paths serve as a seed layer for electroless plating at a subsequent stage of manufacture.

Figure 11:
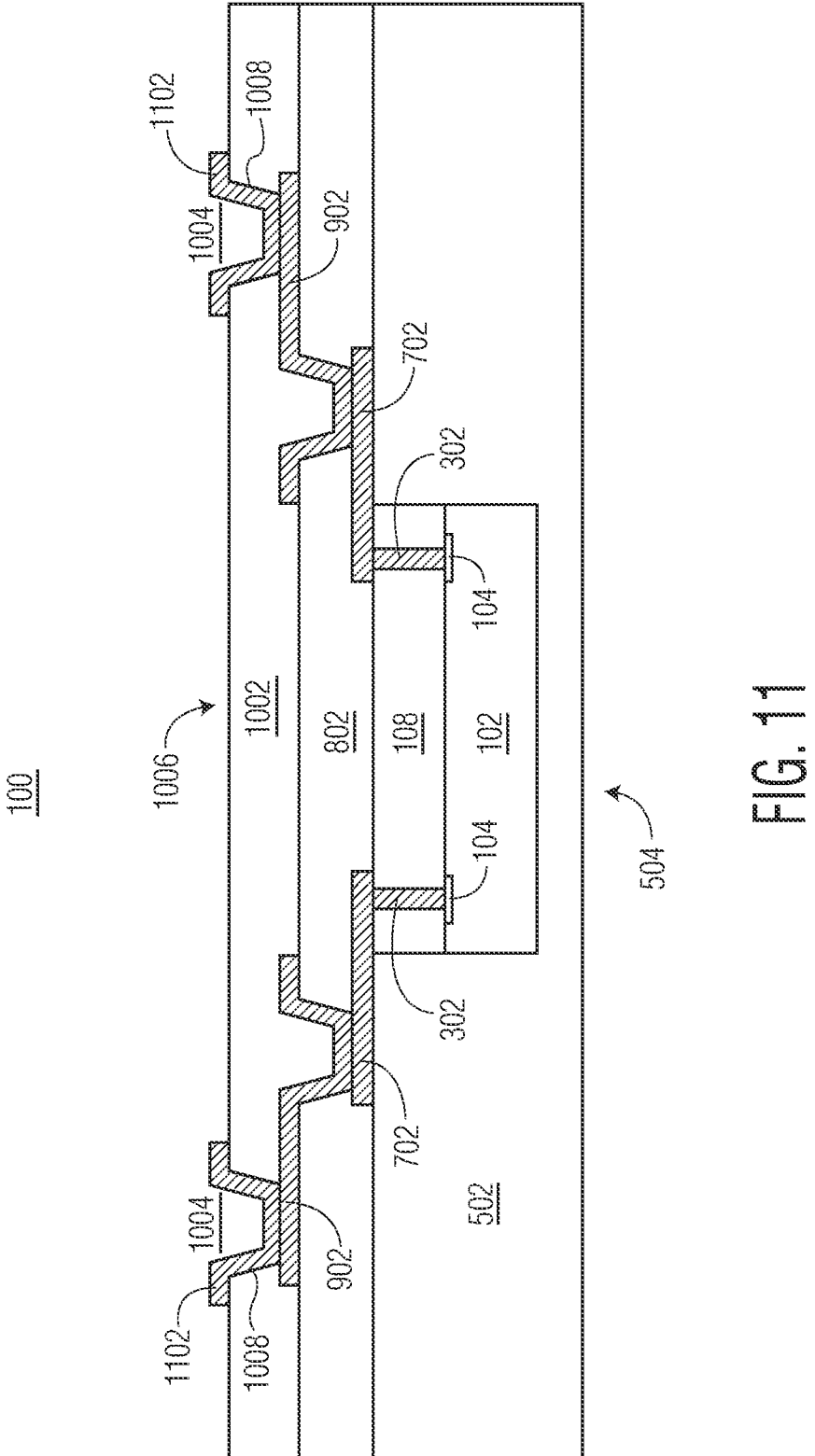

FIG. 11 illustrates, in a simplified cross-sectional view, the example semiconductor device 100 at a subsequent stage of manufacture in accordance with an embodiment. At this stage, the semiconductor device 100 includes conductive traces 1102 formed on the activated sidewalls 1008 of the openings 1004 and activated patterned paths at the major surface 1006. In this embodiment, the semiconductor device 100 is subjected to an electroless plating operation to form a plated conductive material layer (e.g., copper) on the activated sidewalls 1008 and exposed portions of the conductive traces 902. Each of the conductive traces 1102 is configured as an under-bump metallization suitable for attachment of a conductive connector (e.g., solder ball) at a subsequent stage of manufacture. Each of the conductive traces 1102 are interconnected to respective die pads 104 by way of die connectors 302 and traces 702 and 902 of the package substrate, for example.

Figure 12:
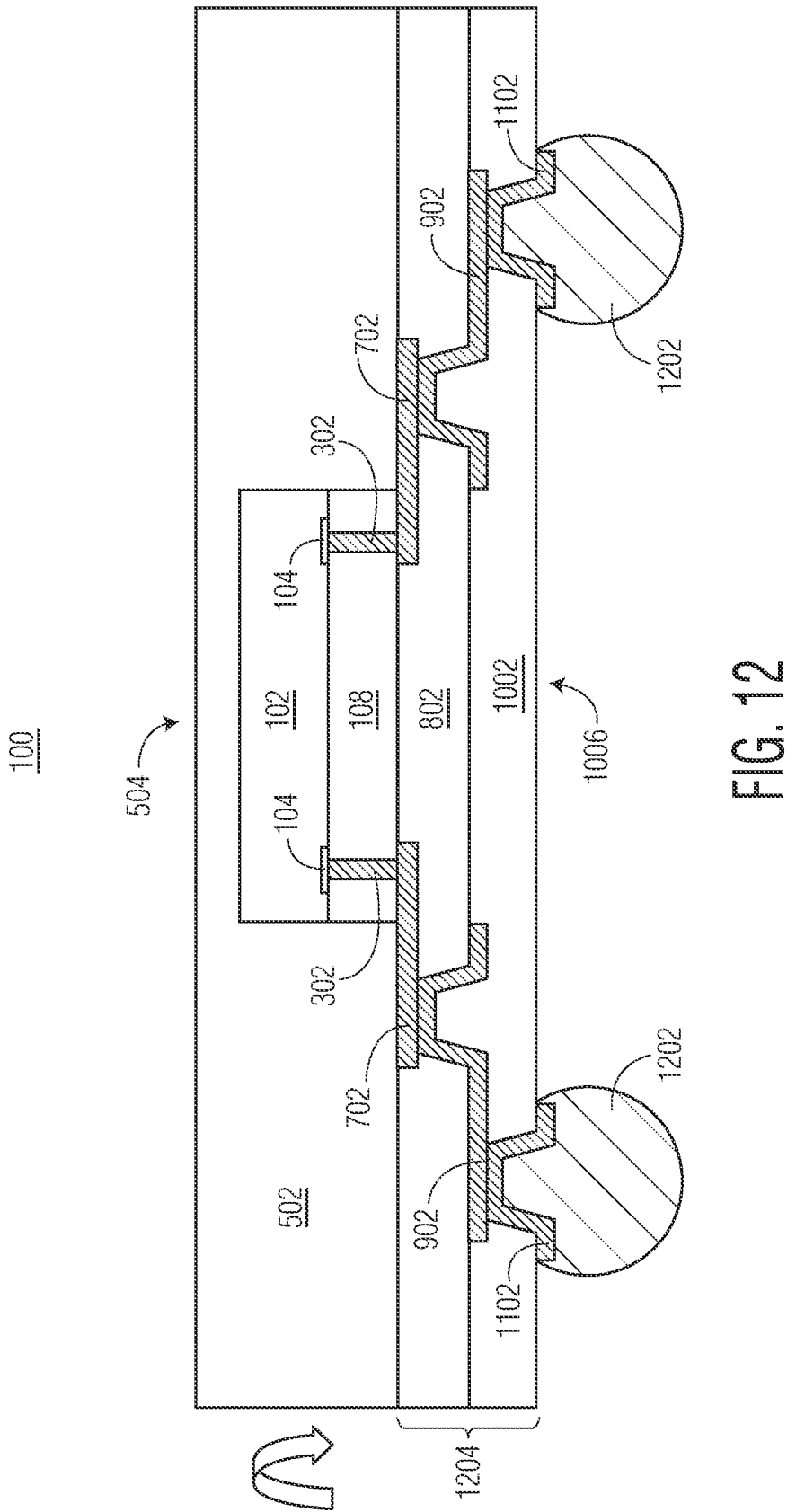

FIG. 12 illustrates, in a simplified cross-sectional view, the example semiconductor device 100 at a subsequent stage of manufacture in accordance with an embodiment. At this stage, the semiconductor device 100 includes conductive connectors 1202 affixed to respective conductive traces 1102 configured as under-bump metallization. The semiconductor device 100 is reconfigured in a bottom-side-down orientation for illustration purposes. The conductive connectors 1202 may be in the form of suitable conductive structures such as solder balls, gold studs, copper pillars, and the like, to connect conductive features of the package substrate 1204 with a printed circuit board (PCB), for example. As an alternative to attaching conductive connectors 1202, the exposed portions of conductive traces 1102 may be plated for subsequent connection with the PCB by way of solder paste attachment or other suitable conductive attachment processes (e.g., ACF, ACP).

In this embodiment, each of the encapsulants 108 and 502 (e.g., encapsulating the semiconductor die 102) have a substantially similar formulation as each of the encapsulants 802 and 1002 of the package substrate 1204. For example, each of the encapsulants 108, 502, 802, and 1002 is an epoxy molding compound which includes a chemical additive (e.g., copper chromate) capable of being activated by way of a laser (e.g., in a laser direct structuring process). By forming the semiconductor device 100 with encapsulants 108 and 502 encapsulating the semiconductor die 102 and the package substrate 1204 including substantially similar encapsulants 802 and 1002, dissimilar mechanical properties (e.g., coefficient of thermal expansion) is virtually eliminated. Accordingly, higher reliability is realized by minimizing or eliminating package stresses commonly associated with dissimilar mechanical properties.

Figure 13:
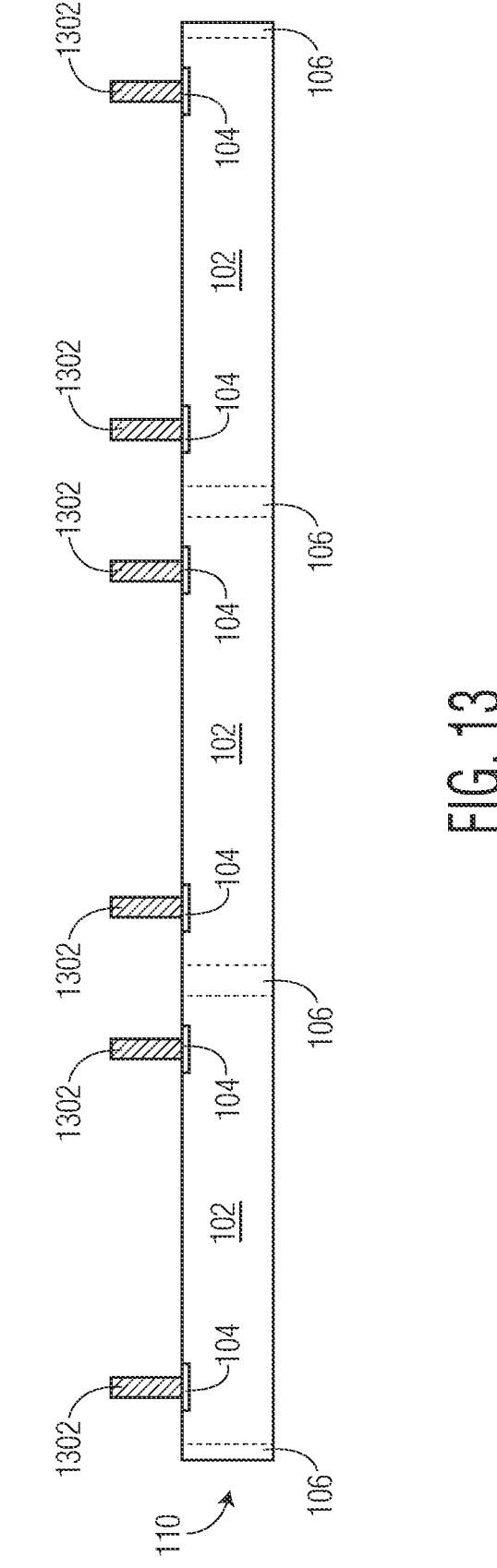
FIG. 13 through FIG. 15 illustrate, in simplified cross-sectional views, the example semiconductor device at alternative stages of manufacture in accordance with an embodiment.
Figure 14:
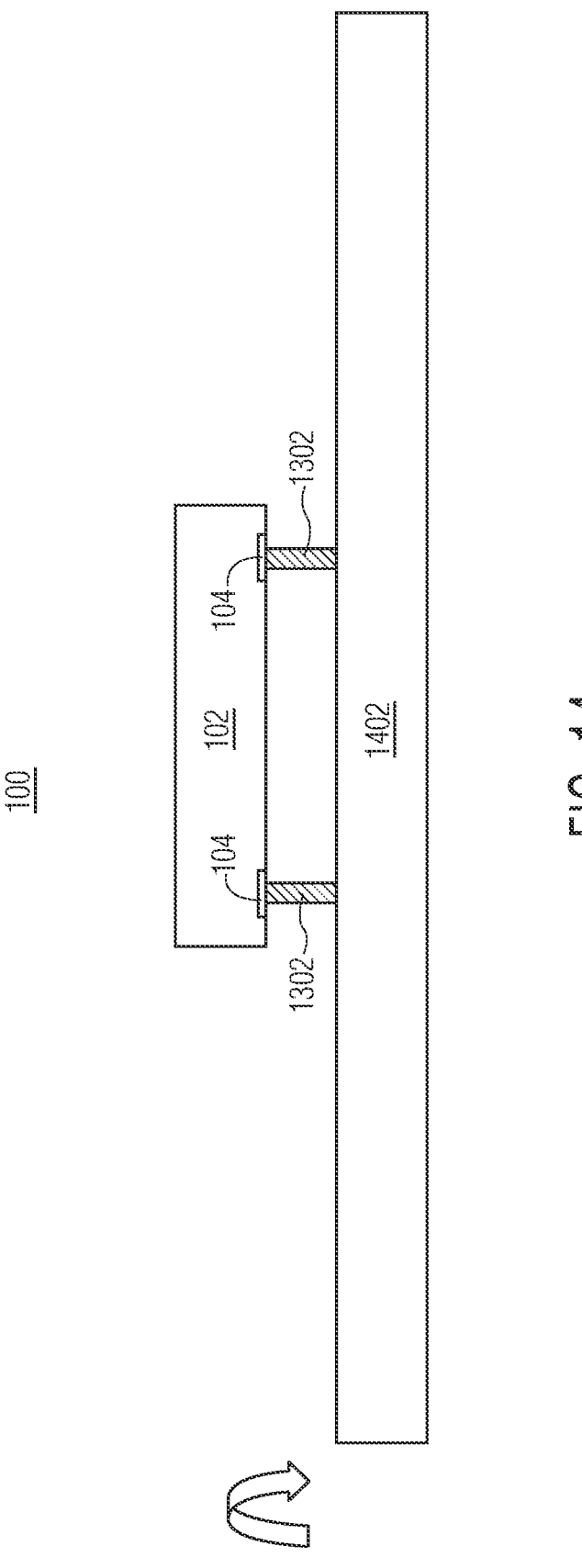
Figure 15:
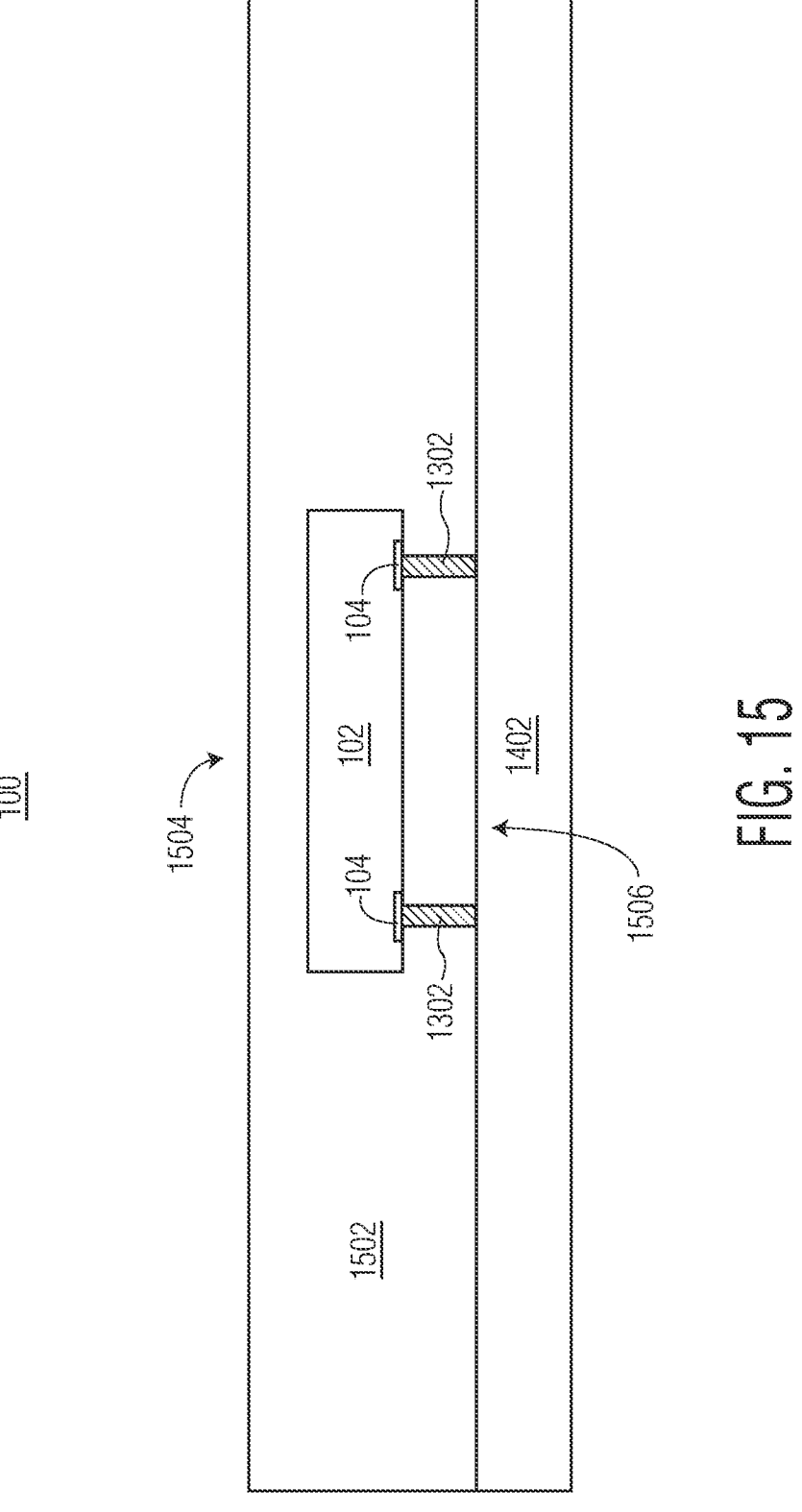

FIG. 13 through FIG. 15 illustrate, in simplified cross-sectional views, the example semiconductor device 100 at alternative stages of manufacture in accordance with an embodiment. The stages of manufacture depicted in FIG. 13 through FIG. 15 are an alternative to the stages of manufacture of the example semiconductor device 100 depicted in FIG. 1 through FIG. 5.

FIG. 13 illustrates, in a simplified cross-sectional view, the example semiconductor device 100 at an alternative stage of manufacture in accordance with an embodiment. At this alternative stage, the example semiconductor device 100 includes conductive stud bumps 1302 formed on respective die pads 104 of the plurality of semiconductor die 102 (sites) of the semiconductor wafer 110. For illustration purposes, singulation lanes 106 illustrated a by dashed lines separate the semiconductor die 102 from one another. In this embodiment, the stud bumps 1302 may be formed from copper, gold, or solder.

FIG. 14 illustrates, in a simplified cross-sectional view, the example semiconductor device 100 at a subsequent stage of manufacture in accordance with an embodiment. At this alternative stage, the semiconductor device 100 includes a singulated semiconductor die 102 and corresponding stud bumps 1302 formed on die pads 104 at the active side. In this embodiment, the semiconductor die 102 with attached stud bumps 1302 is reconfigured in an active-side-down orientation and placed on a carrier substrate 1402. In this configuration, a first end of each stud bump 1302 is attached to a respective die pad 104 and a second end of each stud bump 1302 is temporarily affixed to a carrier substrate 1402.

FIG. 15 illustrates, in a simplified cross-sectional view, the example semiconductor device 100 at a subsequent stage of manufacture in accordance with an embodiment. At this alternative stage, the semiconductor die 102 with attached stud bumps 1302 is encapsulated with an encapsulant 1502 while temporarily affixed to the carrier substrate 1402. In this embodiment, the encapsulant 1502 is an epoxy molding compound formulated for selective activation by way of a laser in a laser direct structuring process. The singulated semiconductor die 102 and stud bumps 1302 are over-molded with the encapsulant 1502 by way of a molding process (e.g., injection molding). In this embodiment, the encapsulant 1502 encapsulates the backside, sidewalls, and most of the active side of the semiconductor die 102. The encapsulated semiconductor device 100 at this stage includes a first major surface 1504 (e.g., top surface) and a second major surface 1506 (e.g., opposite major surface) temporarily affixed to the carrier substrate 1402. Subsequent stages of manufacture remain substantially similar as depicted in FIG. 6 through FIG. 12.

Figure 16:
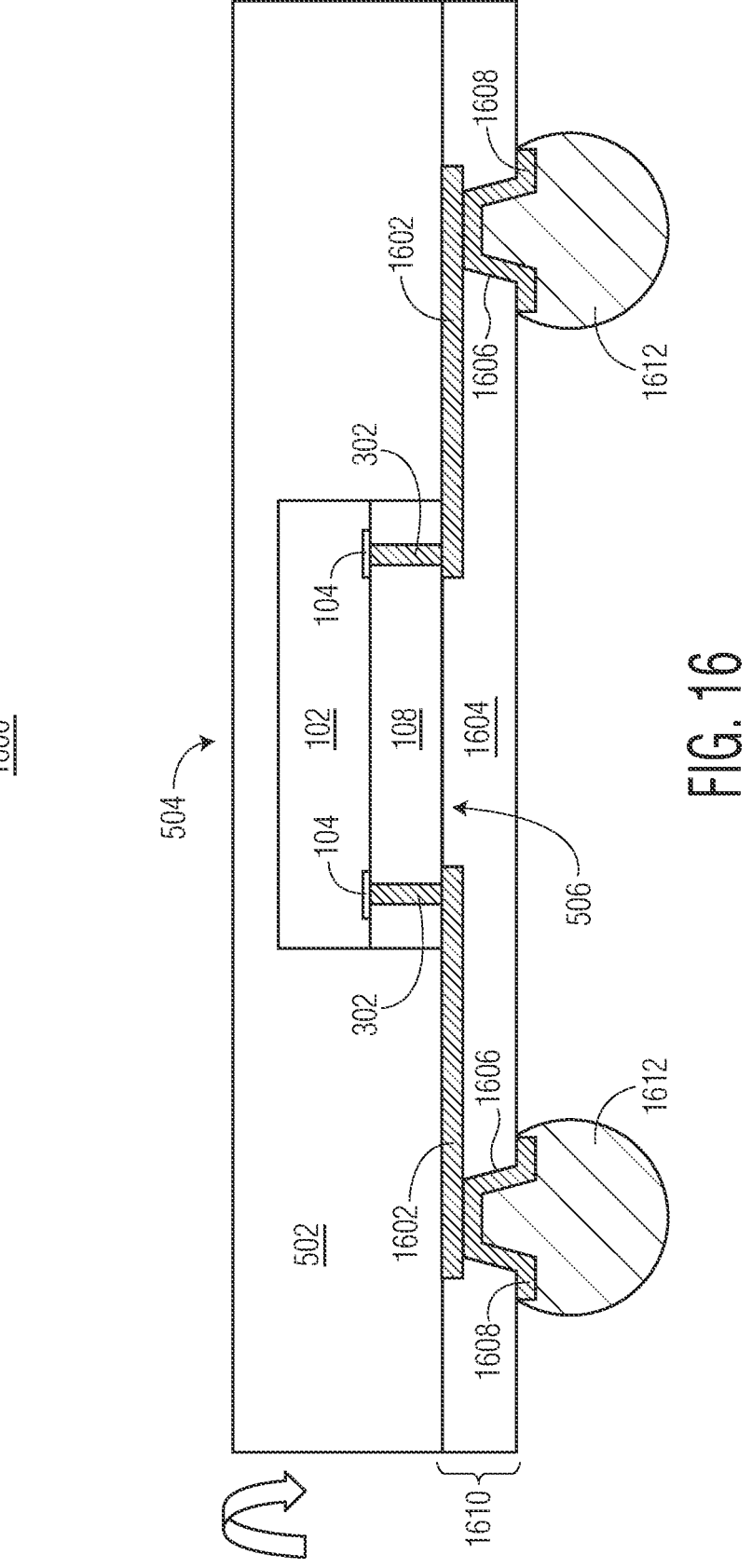
FIG. 16 and FIG. 17 illustrate, in simplified cross-sectional views, alternative example semiconductor devices having active mold packaging at a stage of manufacture in accordance with an embodiment.

FIG. 16 illustrates, in a simplified cross-sectional view, an alternative example semiconductor device 1600 having active mold packaging at a stage of manufacture in accordance with an embodiment. The stage of manufacture depicted in FIG. 16 is an alternative to the stages of manufacture of the example semiconductor device 100 depicted in FIG. 7 through FIG. 12 with the stages of manufacture depicted in FIG. 1 through FIG. 6 remaining substantially similar. The semiconductor device 1600 is reconfigured in a bottom-side-down orientation for illustration purposes.

At this stage, the semiconductor device 1600 includes an alternative package substrate 1610 formed on the major surface 506. In this embodiment, after encapsulating with the encapsulant 502 and forming laser ablated patterned paths at the major surface 506 depicted in FIG. 6, conductive traces 1602 (e.g., copper) are formed on activated patterned paths and exposed second ends of the conductive die connectors 302 at the major surface 506 by way of an electroless plating operation. The plated conductive traces 1602 are interconnected to the die pads 104 of the semiconductor die 102 by way of the conductive die connectors 302. The conductive traces 1602 serve as an interconnect layer of the package substrate 1610 characterized as a build-up RDL type package substrate.

The conductive traces 1602 of the package substrate 1610 and exposed portions of the major surface 506 are encapsulated with an encapsulant 1604. In this embodiment, the encapsulant 1604 is an epoxy molding compound formulated for selective activation by way of a laser in a laser direct structuring process. The encapsulant 1604 is configured to serve as a dielectric layer of the package substrate 1610, for example. In this embodiment, openings are formed through the encapsulant 1604 by way of laser ablation to expose predetermined portions of the conductive traces 1602. The activated sidewalls 1606 serve as a seed layer for electroless plating to form conductive traces 1608. Conductive traces 1608 are configured as under-bump metallization structures of the package substrate 1610. Conductive connectors 1612 are affixed to respective conductive traces 1608. The conductive connectors 1612 may be in the form of suitable conductive structures such as solder balls, gold studs, copper pillars, and the like, to connect conductive features of the package substrate 1610 with a PCB, for example.

Figure 17:
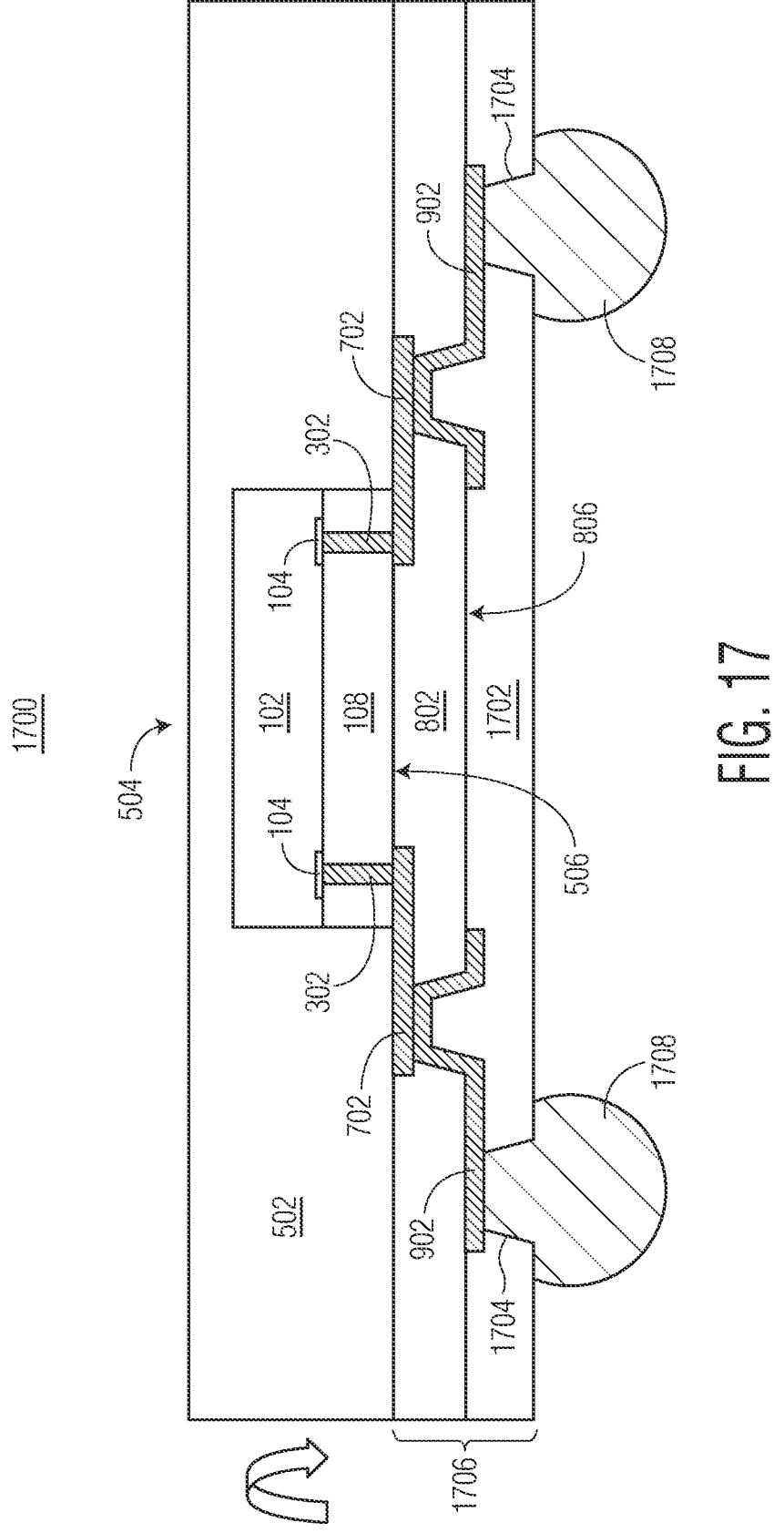

FIG. 17 illustrates, in a simplified cross-sectional view, an alternative example semiconductor device 1700 having active mold packaging at a stage of manufacture in accordance with an embodiment. The stage of manufacture depicted in FIG. 17 is an alternative to the stages of manufacture of the example semiconductor device 100 depicted in FIG. 10 through FIG. 12 with the stages of manufacture depicted in FIG. 1 through FIG. 9 remaining substantially similar. The semiconductor device 1700 is reconfigured in a bottom-side-down orientation for illustration purposes.

At this stage, the semiconductor device 1700 includes an alternative package substrate 1706 formed on the major surface 506. The package substrate 1706 may be characterized as a build-up RDL type package substrate. In this embodiment, after forming conductive traces 902 depicted in FIG. 9, a non-conductive layer 1702 is applied or otherwise deposited on the conductive traces 902, openings 804 (FIG. 8), and exposed portions of the major surface 806. The non-conductive layer 1702 may be formed from suitable non-conducting materials such as polybenzoxazole (PBO), polyimide, and Ajinomoto build-up film (ABF), for example. In this embodiment, the non-conductive layer 1702 is characterized as a photo-imageable polymer material (e.g., photosensitive solder mask material) film. Openings are formed through the non-conductive layer 1702 to expose predetermined portions of the conductive traces 902. Conductive connectors 1708 are affixed to respective exposed portions of conductive traces 902 through the openings. The conductive connectors 1708 may be in the form of suitable conductive structures such as solder balls, gold studs, copper pillars, and the like, to connect conductive features of the package substrate 1706 with a PCB, for example.

Generally, there is provided, a method of forming a semiconductor device including forming a conductive die connector having a first end connected to a die pad of a semiconductor die; encapsulating with a first encapsulant at least a portion of the semiconductor die, the first encapsulant formulated for selective activation by way of a laser; forming a first conductive trace of a redistribution layer by plating a conductive material on a first laser activated path on a first major surface of the first encapsulant, the first conductive trace directly connected to a second end of the die connector; and encapsulating with a second encapsulant at least the first conductive trace and exposed portions of the first major surface of the first encapsulant, the second encapsulant formulated for selective activation by way of a laser. The method may further include forming a first opening in the second encapsulant, the first opening exposing a predetermined portion of the first conductive trace, the second encapsulant activated at the sidewalls of the first opening; and forming a second conductive trace of the redistribution layer by plating the conductive material on the activated sidewalls of the first opening and exposed portion of the first conductive trace. The second conductive trace may be configured as an under-bump metallization structure. The method may further include affixing a conductive connector to the second conductive trace. The second conductive trace may be configured as a via connected to the first conductive trace and a portion of the second conductive trace may be extended laterally along a portion of a major surface of second encapsulant. The method may further include encapsulating with a third encapsulant at least the second conductive trace and exposed portions of the major surface of the second encapsulant, the third encapsulant formulated for selective activation by way of the laser; forming a second opening in the third encapsulant, the second opening exposing a predetermined portion of the extended portion of the second conductive trace, the third encapsulant activated at the sidewalls of the second opening; and forming a third conductive trace of the redistribution layer by plating the conductive material on the activated sidewalls of the second opening and exposed portion of the second conductive trace. The method may further include affixing a conductive connector to the third conductive trace, the third conductive trace configured as an under-bump metallization structure. The method may further include depositing a solder mask material over the second conductive trace and exposed portions of the second encapsulant; and forming an opening in the solder mask material, the opening exposing a predetermined portion of the second conductive trace. The method may further include affixing a conductive connector to the exposed portion of the second conductive trace.

In another embodiment, there is provided, a method of forming a semiconductor device including forming a conductive die connector having a first end connected to a die pad of a semiconductor die; encapsulating with a first encapsulant at least a portion of the semiconductor die, the first encapsulant formulated for selective activation by way of a laser; and forming a redistribution layer over a first major surface of the first encapsulant and an exposed second end of the conductive die connector, the redistribution layer including: a first plated conductive trace formed on an activated portion of the first encapsulant and connected to the second end of the die connector, and a second encapsulant encapsulating at least the first plated conductive trace, the second encapsulant formulated for selective activation by way of the laser. The forming the conductive die connector may include affixing a plurality of stud bumps to respective die pads of a plurality of semiconductor die in wafer form. The encapsulating with the first encapsulant the at least portion of the semiconductor die may include encapsulating with the first encapsulant at least a backside and sidewalls of the semiconductor die while on a carrier substrate. The method may further include before forming the conductive die connector, encapsulating an active side of a wafer with an encapsulant formulated for selective activation by way of the laser, the semiconductor die one of a plurality of semiconductor die formed on the wafer. The forming the conductive die connector may include forming a plurality of openings through the encapsulant to expose respective die pads of the plurality of semiconductor die and plating the activated sidewalls of the plurality of openings. The redistribution layer may further include a first opening formed in the second encapsulant, the first opening exposing a predetermined portion of the first plated conductive trace, the second encapsulant activated at the sidewalls of the first opening; and a second plated conductive trace formed on the activated sidewalls of the first opening and exposed portion of the first plated conductive trace.

In yet another embodiment, there is provided, a semiconductor device including a semiconductor die including a die pad; a first encapsulant encapsulating at least a portion of the semiconductor die; a package substrate including a second encapsulant encapsulating a bottom major surface of the encapsulated semiconductor die, the second encapsulant formulated for selective laser activation; and a first plated trace formed on activated portions of the second encapsulant, the first plated trace interconnected to the die pad. The semiconductor device may further include a conductive die connector having a first end directly connected to the die pad and a second end directly connected to the first plated trace. The semiconductor device may further include a third encapsulant formulated for selective laser activation and disposed between an active side of the semiconductor die and the second encapsulant, the conductive die connector formed as a plated conductor through the third encapsulant. The package substrate may further include a fourth encapsulant encapsulating at least the first plated trace and a bottom major surface of the second encapsulant, the fourth encapsulant formulated for selective laser activation; an opening formed through the fourth encapsulant, the opening configured to expose a predetermined portion of the first plated trace, the fourth encapsulant activated at the sidewalls of the opening; and a second plated trace formed on the activated sidewalls of the opening and exposed portion of the first plated trace, the second plated trace configured as an under-bump metallization structure. The semiconductor device may further include a conductive connector affixed to the second plated trace.

By now, it should be appreciated that there has been provided a semiconductor device with active mold packaging. The active mold packaging includes encapsulants formulated for selective activation by way of a laser in a laser direct structuring process. The semiconductor device includes a core encapsulant at least partially encapsulating a semiconductor die and a package substrate formed on a major surface of the core encapsulated semiconductor die. The package substrate is formed as a build-up package substrate and includes plated conductive traces separated by one or more encapsulant layers. The core encapsulant and each of the one or more encapsulant layers of the package substrate are epoxy molding compounds which include a chemical additive that forms metal particles when activated by way of a laser. First conductive traces of the package substrate are formed by way of a plating process utilizing activated patterned paths on the major surface. The first conductive traces are interconnected to die pads of the semiconductor die. A subsequent encapsulant layer of the package substrate is formed over the first conductive traces and exposed portions of the major surface. Openings through the subsequent encapsulant and patterned paths are formed using laser ablation thus activating the first encapsulant at the sidewalls of the openings and along the patterned paths. Second conductive traces of the package substrate are formed by way of a plating process utilizing activated openings sidewalls and patterned paths of the subsequent encapsulant. The second conductive traces are interconnected to first conductive traces by way of a via portion of the second conductive traces. The via portion may be configured as an under-bump metallization for subsequent attachment of solder balls. By forming the semiconductor device with the core encapsulant and each of the one or more encapsulant layers of the package substrate in this manner, mismatch of mechanical properties such coefficient of thermal expansion is virtually eliminated, thus improving overall semiconductor device reliability.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A semiconductor device comprising:
a semiconductor die including an active surface, a bottom surface opposite the active surface, sidewalls extending between the active surface and the bottom surface, and a die pad at the active surface of the semiconductor die;

a first encapsulant formulated for selective laser activation, wherein the first encapsulant has overlies the active surface of the semiconductor die, and the first encapsulant has a major surface, sidewalls, and a first laser-activated patterned path at the major surface of the first encapsulant;

a second encapsulant formulated for selective laser activation, wherein the second encapsulant contacts the sidewalls of the first encapsulant, and the second encapsulant has a major surface and a second laser-activated patterned path at the major surface of the second encapsulant;

a conductive die connector extending through the first encapsulant, the conductive die connector having a first end and a second end, wherein the first end is directly connected to the die pad, and the second end is exposed at the major surface of the first encapsulant; and a first plated trace that includes a first conductive material portion formed on the first laser-activated patterned path of the first encapsulant, wherein the first conductive material portion of the first plated trace is coupled to the second end of the conductive die connector, and a second conductive material portion formed on the second laser-activated patterned path of the second encapsulant, wherein the second conductive material portion of the first plated trace is directly connected to the first conductive material portion of the first plated trace.

2. The semiconductor device of claim 1, further comprising:

a third encapsulant encapsulating at least the first plated trace and the major surface of the second encapsulant;

an opening formed through the third encapsulant, the opening configured to expose a predetermined portion of the first plated trace; and a second plated trace formed on sidewalls of the opening and on the predetermined portion of the first plated trace.

3. The semiconductor device of claim 2, further comprising a conductive connector affixed to the second plated trace.

4. The semiconductor device of claim 2, wherein:

the third encapsulant is formulated for selective laser activation; and the third encapsulant is activated at the sidewalls of the opening through the third encapsulant.

5. The semiconductor device of claim 2, wherein the second plated trace is configured as an under-bump metallization structure.

6. The semiconductor device of claim 1, wherein the conductive die connector is a stud bump affixed to the die pad of the semiconductor die.

7. The semiconductor device of claim 1, wherein the conductive die connector is plated on a laser-activated sidewall of an opening in the first encapsulant.

8. The semiconductor device of claim 1, wherein:

the first laser-activated patterned path of the first encapsulant includes first metal particles sufficient to serve as a first seed layer for electroless plating; and the second laser-activated patterned path of the second encapsulant includes second metal particles sufficient to serve as a second seed layer for the electroless plating.

9. The semiconductor device of claim 1, wherein:

the first laser-activated patterned path of the first encapsulant includes a first thin conductive patterned path; and the second laser-activated patterned path of the second encapsulant includes a second thin conductive patterned path.

10. The semiconductor device of claim 1, wherein the second encapsulant surrounds a perimeter of the active surface of the semiconductor die.

11. The semiconductor device of claim 1, wherein the second encapsulant directly contacts sidewalls of the semiconductor die.

12. The semiconductor device of claim 11, wherein the second encapsulant also directly contacts a bottom surface of the semiconductor die opposite the active surface.

13. The semiconductor device of claim 1, wherein the major surface of the first encapsulant and the major surface of the second encapsulant are coplanar.

14. A semiconductor device comprising:

a semiconductor die including a die pad on an active surface of the semiconductor die;

a first encapsulant formulated for selective laser activation, wherein the first encapsulant overlies the active surface of the semiconductor die, and the first encapsulant has a major surface, sidewalls, and a first laser-activated patterned path at the major surface of the first encapsulant;

a second encapsulant formulated for selective laser activation, wherein the second encapsulant surrounds the active surface of the semiconductor die and directly contacts the sidewalls of the first encapsulant, sidewalls of the semiconductor die, and a bottom surface of the semiconductor die opposite the active surface, and wherein the second encapsulant has a major surface and a second laser-activated patterned path at the major surface of the second encapsulant;

a conductive die connector formed as a plated conductor through the first encapsulant, the conductive die connector having a first end directly connected to the die pad and a second end exposed at the major surface of the first encapsulant;

a first portion of a first plated trace formed on the first laser-activated patterned path of the first encapsulant, the first portion of the first plated trace electrically interconnected to the die pad through the conductive die connector; and a second portion of the first plated trace formed on the second laser-activated patterned path of the second encapsulant and directly connected to the first portion of the first plated trace.

15. The semiconductor device of claim 14, further comprising:

a third encapsulant encapsulating at least the first plated trace and the major surface of the second encapsulant;

an opening formed through the third encapsulant, the opening configured to expose a predetermined portion of the first plated trace; and a second plated trace formed on sidewalls of the opening and on the predetermined portion of the first plated trace.

16. The semiconductor device of claim 15, further comprising a conductive connector affixed to the second plated trace.

* * * * *